June 28, 1966 W. HOTINE ETAL 3,257,707

ELECTRICAL INTERCONNECTION PROCESS

Filed Feb. 1, 1965

INVENTORS.
WILLIAM HOTINE,
ANDREW E. FLANDERS,
BY [signature]
ATTORNEY.

United States Patent Office 3,257,707
Patented June 28, 1966

3,257,707

ELECTRICAL INTERCONNECTION PROCESS

William Hotine, Idyllwild, and Andrew E. Flanders, Pomona, Calif., assignors to General Dynamics Corporation, Pomona, Calif.

Filed Feb. 1, 1965, Ser. No. 429,446
10 Claims. (Cl. 29—155.5)

This invention relates to electrical interconnection processes, particularly to the electrical interconnection of electronic subassemblies, and more particularly to a process for achieving welded connections between the leads of module encapsulated electronic components and their interconnecting circuitry.

Previous known methods used for interconnecting electronic components, particularly microminiature electronic subassemblies involved tedious and time consuming operations. Prior known welding techniques for interconnecting component leads have necessarily used two welding electrodes, accurately positioned by a skilled operator at the location of the component lead, and thereby producing a rate of welds made and a reliability thereof which is directly related to the skill and speed of the operator.

The present invention essentially eliminates the above mentioned disadvantages of the prior known interconnection methods in that it provides a process which includes a single welding electrode technique adapted to fast positioning on, and automatic welding of electrical components, with particular utility in the welding of flat etched circuitry to ends of component leads at the surface of a module.

Therefore, it is an object of this invention to provide a new technique for producing electrical interconnections of components which overcomes the disadvantages of the prior art techniques.

A further object of the invention is to provide a new technique for interconnecting components of electronic modules.

Another object of the invention is to provide a process for connecting flat etched circuitry to ends of component leads which includes a technique utilizing a single welding electrode.

Another object of the invention is to provide a single welding electrode technique adapted to fast positioning on, and automatic welding of flat etched circuitry to ends of component leads at the surface of a module.

Other objects of the invention will become readily apparent from the following description and accompanying drawings wherein.

Briefly, the invention relates to a process for achieving welded connections between the leads of module encapsulated electronic components and their interconnecting circuitry. An assembled module unit is provided with low melting point metal inlays encompassing all of the terminal lead ends on opposing sides of the module. These sides are faced off so as to be flat and the cerro metal surfaces are operated on by means to remove some of the cerro metal so that the lead ends project slightly above the surface. A circuit arrangement is then placed in registry with the terminal lead ends. A multiple electrode welding head having a common actuating means is brought to bear on the circuitry, the welding electrodes being registered over the proper lead positions by means of alignment pins. Welding current is supplied to each of the electrodes, the return path being taken through the cerro metal inlays. After the welding is finished, the cerro metal is melted and removed from the module surface, leaving the connecting circuitry suspended on the lead ends but in the same general plane as the side of the module.

Figure 1:
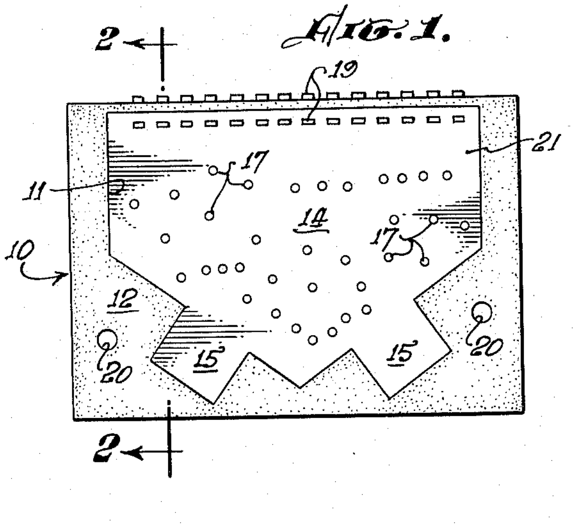
FIG. 1 is a view showing one side of an electronic module prepared in accordance with the invention.
Figure 2:
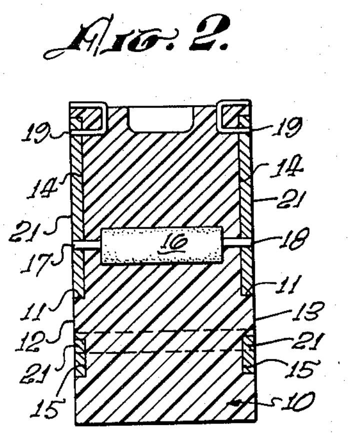
FIG. 2 is a partial cross-sectional view taken substantially along line 2—2 of FIG. 1.

Referring now to the drawings, FIGS. 1 and 2 show a module 10 assembled to encapsulate electronic components. Module 10 is recessed at 11 on sides 12 and 13 thereof (see FIG. 2), recess 11 including an area 14 and adjoining areas 15. Electronic components indicated at 16 having leads 17 and 18 are positioned in module 10 so that the leads extend into areas 14 of recesses 11. Also terminal members 19 positioned in module 10 have one end thereof extending into an area 14. Areas 15 serve as contact pads during the welding operation as described hereinafter. Module 10 is also provided on each of the sides 12 and 13 with holes 20 which serve to align the welding electrodes over the component leads 17 and 18 during the welding operation.

Recesses 11 are filled with molten cerro metal indicated at 21 in FIG. 2, cerro metal being defined as a low melting point alloy. If desired a high temperature lubricant may be applied to the recesses 11 of module 10 prior to the application of the cerro metal. The cerro metal 21 surrounds the ends of all the leads 17 and 18 of components 16 making good electrical contact with the leads.

The sides 12 and 13 of module 10 having the recesses 11 filled with cerro metal 21 are then finished to a flat surface as shown in FIG. 2 by any suitable operation, such as holding these sides of the module to a sanding belt.

Figure 4:
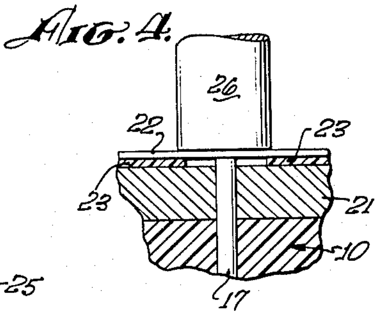
FIG. 4 is an enlarged view partially in cross-section illustrating the positioning of the component lead, the circuitry and a welding electrode.

The surfaces of the cerro metal 21 are operated on to remove a desirable portion, for example, a few thousandths of an inch, of the cerro metal, leaving the ends of leads 17 and 18 projecting above the surface of the cerro metal 21 as shown in FIG. 4. This operation can be accomplished, for example, by applying a wire brush to surfaces of the cerro metal 21, this being done either manually or automatically.

After the ends of component leads 17 and 18 have been exposed as described directly above, a flat material comprising etched circuits indicated at 22 and insulation backing 23, except at the areas of the component lead ends (see FIG. 4), is positioned over the ends of leads 17 and 18 within areas 14 of each side 12 and 13 of module 10. Areas 15 of recesses 11 are not covered by the circuit material 22.

A multiple electrode welding head 24 supported on actuating rods 25 is brought to bear on top of the flat etched circuit 22, registering welding electrodes 26 over the position of each of the component leads 17 and 18. For purpose of illustration and clarity only one welding head 24 is shown positioned on side 12 of module 10, and only two electrodes 26 are shown positioned in head 24. However, in actual construction, welding head 24 may be provided with an electrode 26 for each component lead extending from the cerro metal surfaces. Also a welding head 24 may be located on the side 13 of module 10 so that both sides of the module could be welded simultaneously or in desired sequence.

Figure 3:
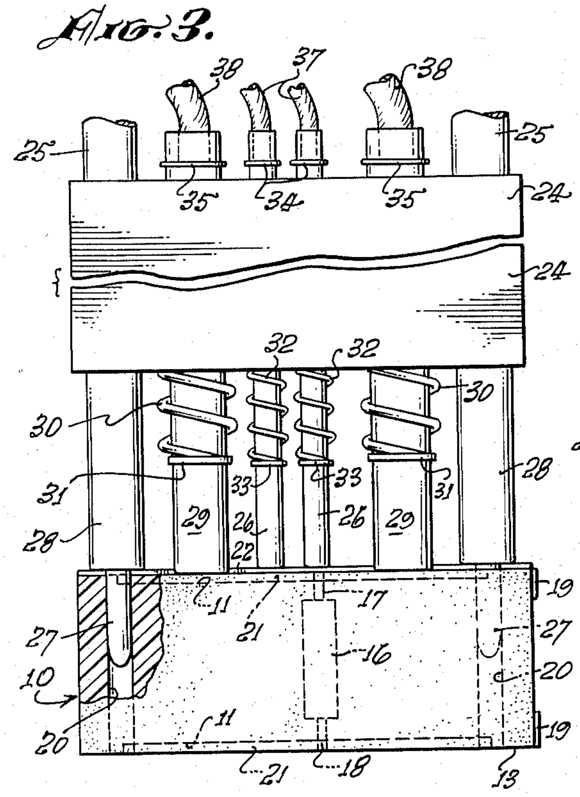
FIG. 3 is a view illustrating the welding apparatus positioned on one side of the FIG. 1 module.

As shown in FIG. 3, welding electrodes 26 are registered over the position of leads 17 by means of dowel pins 27 on rods 28 which fit in holes 20 in module 10, rods 28 being fixed to, or integral with, welding head 24. Also operatively connected to welding head 24 are return circuit members or electrodes 29 which, when head 24 is positioned on module 10 by dowels 27, are in contact with the cerro metal 21 in contact areas or pads 15 of recess 11. Members 29 are urged against areas 15 by springs 30 which abut head 24 and retainer rings 31. Springs 32, which abut head 24, press against retainer rings 33 mounted on electrode 26 to urge electrodes 26 into contact with circuit material 22 and presses the circuit material against the projecting ends of leads 17, the insulating film or backing 23 serving to support the etched circuit on the cerro metal 21. Electrodes 26 are retained in welding head 24 by retainer rings 34 while retainer rings 35 serve to retain return circuit members 29 in head 24. Electrodes 26 and means 29 are connected to an electrical power source 36 as shown in FIG. 5 by conduit means 37 and 38, respectively.

Figure 5:
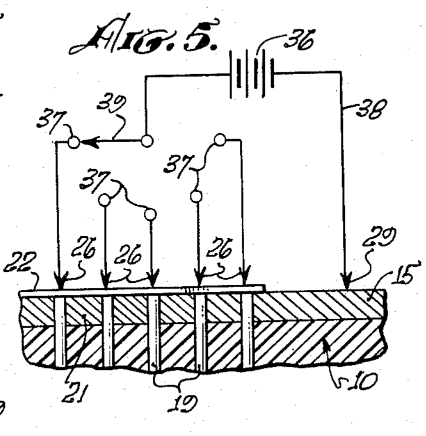
FIG. 5 is a schematic view illustrating the electrical circuitry of the FIG. 3 welding apparatus.

FIG. 5 illustrates, by way of example only, a schematic electrical circuit for the welding equipment described above. Welding current from source 36 is, in this embodiment, sequentially fed to a plurality of leads 37 by switch means 39, which represents an electronic SCR commutator. Each electrode 26 welds its associated lead 17 to circuit 22 in turn, in a few milliseconds for each weld, the return circuit to source 36 being through cerro metal 21, members 29 and conduits 38. The area of the flat bottom of welding electrodes 26 is sufficient to allow a large tolerance variation in the positioning thereof with respect to the component lead 17. It should be noted that the component leads serve during the welding operation as return electrodes for the circuit.

After the welding of the component leads 17 to the circuits 22 has been accomplished, the cerro metal 21 is melted and removed by means such as an air blast. As the cerro metal 21 does not adhere to the surface of the module 10, which is usually a plastic, the resistivity of this surface is preserved. As pointed out above, a high temperature lubricant may be applied prior to applying the cerro metal to aid in the complete disposal of the cerro metal after it has served its purpose of providing the return circuit between the component leads and the return circuit member 29 of the welding apparatus.

As pointed out above, a welding head 24 and associated supply and return circuits may be utilized on each side of the module 10 for simultaneous welding of the component leads 17 and 18, each head 24 being connected to the same or to a different power source. Also, the welds may be made simultaneous or in any desired sequence.

In utilizing the method of the invention, molten cerro (low melting point) metal is poured into preformed recesses in an electronic module or the like, the leads of components thereof to be interconnected protruding into the recessed areas. After the cerro metal has cooled, the surfaces of the module are finished to essentially a flat surface. Then a small portion of the cerro metal is removed to leave the ends of the components protruding therefrom. The material defining the desired circuits is then placed over the component lead ends in proper relationship. Thereafter the leads are interconnected by welding to their respective circuits by positioning a welding electrode on the circuit and above its component lead, with the return circuit being through the component lead and the cerro metal to the welding apparatus. Upon completion of the welding operation, the cerro metal is heated and removed from the module leaving the connecting circuitry suspended on the lead ends but in the same plane as the side of the module.

It has thus been shown that this invention provides an effective and economical method of producing interconnections between electronic subassemblies, particularly for the interconnection of flat etched circuitry to ends of component leads at the surface of a module.

While a specific sequence of steps and specific apparatus have been illustrated and described for carrying out the invention, modifications and changes will become apparent to those skilled in the art, and it is intended to cover in the appended claims all such modifications and changes as come within the true spirit and scope of the invention.

What we claim is:

1. A method for producing electrical interconnections comprising the steps of surrounding one of the members to be interconnected with a metal having a low melting point so that good electrical contact is provided therewith while leaving a portion of the member exposed, positioning the other of the members to be interconnected adjacent the one member, interconnecting the members by applying an electrical current thereacross, the one member and the low melting point metal serving as part of the electrical return circuit, and removing the low melting point metal.

2. A method for interconnecting electronic subassemblies by utilizing a low melting point metal as a temporary current return path comprising the steps of encompassing the terminal leads of electronic subassemblies to be interconnected with a metal having a low melting point while leaving the end of the terminal leads projecting slightly above the surface of the metal, positioning a circuit arrangement in registry with the terminal lead ends, interconnecting each of the terminal leads to the associated registered circuit by applying an electrical current thereacross, the terminal leads and the low melting point metal serving as part of the electrical current return path, and removing the low melting point metal leaving the connected circuitry suspended on the terminal lead ends.

3. A process for producing welded connections between the leads of module encapsulated electronic components and their interconnecting circuitry comprising the steps of providing an assembled module unit with inlays of a metal having a low melting point, the inlays encompassing all of the terminal lead ends on opposing sides of the module, facing off the sides of the module having the metal inlays to provide a flat surface, removing a portion of the metal so that the lead ends project slightly above the metal surface, registering a flat circuit arrangement with the terminal lead ends, aligning a multiple electrode welding apparatus on top of the flat circuitry so that the welding electrodes thereof are registered over the proper lead, supplying a welding current to each of the welding electrodes with the return path being taken through the low melting point metal inlays, and removing the metal inlays leaving the connecting circuitry suspended on the lead ends and in the same general plane as the side of the module.

4. A process for producing interconnections between the leads of module encapsulated electronic subassemblies and their interconnecting circuitry comprising the steps of: providing an assembled module unit, having recessed areas in the sides thereof, with inlays of a low melting point metal which encompasses all of the terminal lead ends on opposing sides of the module; operating on the sides of the modules having the metal inlays to provide a flat surface of the module, terminal leads, and metal inlays; exposing the terminal lead ends by removing a portion of the metal inlays; registering the interconnecting circuitry over the terminal lead ends, positioning a welding apparatus having multiple welding electrodes on top of the circuitry so that a welding electrode is located over each of the terminal lead ends, interconnecting the terminal leads to the circuitry by supplying a welding current to each of the electrodes, the return path being through the metal inlay, and melting and removing the metal from the recessed areas of the module.

5. The process defined in claim 4, wherein the welds between the circuitry and the terminal leads are made simultaneously.

6. The process defined in claim 4, wherein the welds between the circuitry and each of the terminal leads are made sequentially.

7. A method for producing interconnections between the leads of module encapsulated components and their interconnecting circuitry comprising the steps of filling recessed areas in the module with a low melting point metal for encompassing all of the terminal leads on the sides of the module, after the metal has cooled, finishing the sides of the module to essentially a flat surface, removing a portion of the metal so that the ends of the terminal leads protrude therefrom, positioning material defining the circuitry over the component lead ends in proper relationship, interconnecting by welding the terminal leads to their respective circuits, and removing the low melting point metal.

8. The method defined in claim 7, wherein the welding operation is accomplished by positioning an electrode over each of the terminal leads to, and supplying a welding current to each of the electrodes, the return path being through the metal.

9. The method defined in claim 8, wherein the welds between the circuitry and the terminal leads are made simultaneously.

10. The method defined in claim 8, wherein the welds between the circuitry and each of the terminal leads are made sequentially.

References Cited by the Applicant

UNITED STATES PATENTS

| | | | |
|---|---|---|---|
| 2,862,992 | 12/1958 | Franz. | |
| 3,029,495 | 4/1962 | Doctor. | |

References Cited by the Examiner

UNITED STATES PATENTS

| | | | |
|---|---|---|---|
| 2,194,687 | 3/1940 | Biederman | 219—111 |
| 2,389,324 | 11/1945 | Pedley | 219—87 |
| 3,079,482 | 2/1963 | Gutbier | 219—85 |
| 3,136,032 | 6/1964 | Berndsen | 29—155.5 |
| 3,192,358 | 6/1965 | Lasch et al. | 219—85 |

JOHN F. CAMPBELL, *Primary Examiner.*

P. M. COHEN, *Assistant Examiner.*